(12) United States Patent
Muchherla et al.

(10) Patent No.: US 11,360,677 B2
(45) Date of Patent: Jun. 14, 2022

(54) SELECTIVE PARTITIONING OF SETS OF PAGES PROGRAMMED TO MEMORY DEVICE

(71) Applicant: Micron Technology, Inc., Boise, ID (US)

(72) Inventors: Kishore Kumar Muchherla, Fremont, CA (US); Karl D. Schuh, Santa Cruz, CA (US); Jiangang Wu, Milpitas, CA (US); Mustafa N. Kaynak, San Diego, CA (US); Devin M. Batutis, San Jose, CA (US); Xiangang Luo, Fremont, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 25 days.

(21) Appl. No.: 16/948,305

(22) Filed: Sep. 11, 2020

(65) Prior Publication Data

US 2022/0083243 A1 Mar. 17, 2022

(51) Int. Cl.
*G06F 3/06* (2006.01)
(52) U.S. Cl.
CPC .......... *G06F 3/0631* (2013.01); *G06F 3/0604* (2013.01); *G06F 3/0679* (2013.01)

(58) Field of Classification Search
CPC .............................. G06F 3/0679; G06F 3/0604
See application file for complete search history.

(56) References Cited

U.S. PATENT DOCUMENTS

| | | | |
|---|---|---|---|
| 2008/0228896 A1* | 9/2008 | Krig ...................... | G06F 13/385 |
| | | | 709/212 |
| 2017/0199746 A1* | 7/2017 | Nguyen ................ | G06F 9/4401 |
| 2017/0271031 A1* | 9/2017 | Sharon ................ | G06F 11/3058 |
| 2019/0130966 A1* | 5/2019 | Danjean ............. | G11C 11/5642 |
| 2019/0146671 A1* | 5/2019 | Camp ................... | G06F 3/0688 |
| | | | 711/103 |

* cited by examiner

*Primary Examiner* — David Yi
*Assistant Examiner* — Nicholas A. Paperno
(74) *Attorney, Agent, or Firm* — Lowenstein Sandler LLP

(57) ABSTRACT

A system includes a memory device having multiple of dice and a processing device operatively coupled to the memory device. The processing device performs operations including receiving memory operations to program sets of pages of data across at least a subset of the plurality of dice and identifying a plurality of the sets of pages experiencing a variation in a data state metric satisfying a threshold criterion. The operations further include partitioning, into a set of partitions, a set of pages of the plurality of the sets of pages, programming the set of partitions to the plurality of dice, and storing, in a metadata table, at least one bit to indicate that the first set of pages is partitioned.

15 Claims, 11 Drawing Sheets

SELECTIVE PARTITIONING OF SETS OF PAGES PROGRAMMED TO MEMORY DEVICE

TECHNICAL FIELD

Embodiments of the disclosure are generally related to memory sub-systems, and more specifically, are related to selective partitioning of sets of pages programmed to a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
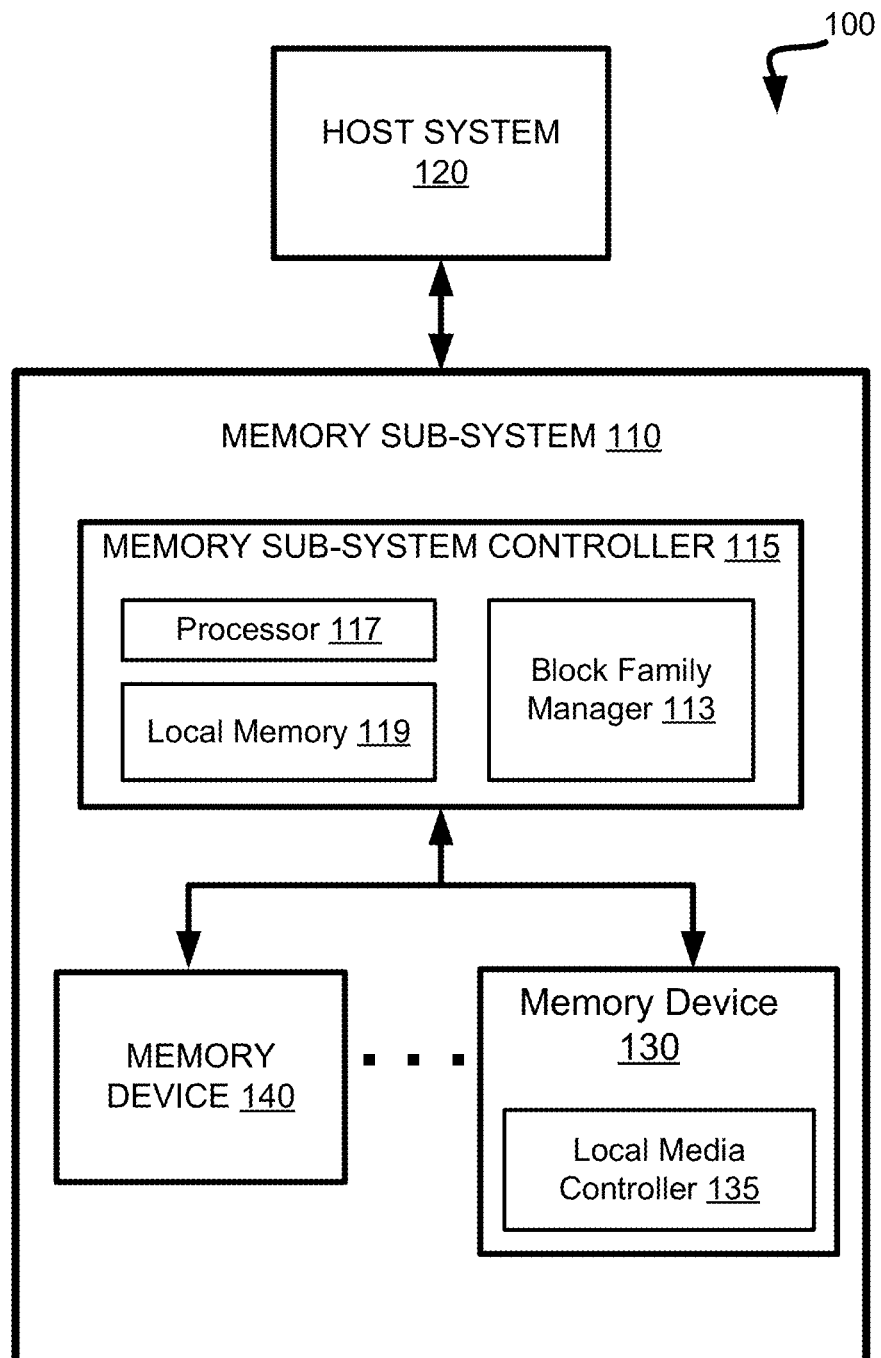
FIG. 1 illustrates an example computing system that includes a memory sub-system in accordance with some embodiments.

Embodiments of the present disclosure are directed to selective partitioning of sets of pages programmed to a memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. A "block" herein refers to a set of contiguous or non-contiguous memory pages. An example of a block is an erasable block, which is a minimal erasable unit of memory, while a page is a minimal writable unit of memory. Each page includes a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information or data. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell degrades, which is referred to as "temporal voltage shift" (TVS), since the degrading electric charge causes the voltage distributions to shift along the voltage axis towards lower voltage levels. The threshold voltage is changing rapidly at first (immediately after the memory cell was programmed), and then slows down in an approximately logarithmic linear fashion with respect to the time elapsed since the cell programming event. Slow charge loss can also increase with increasing temperature of memory cells as well as with increasing program erase cycles, among other factors.

Various common implementations, however, either fail to adequately address the TVS or employ inefficient strategies resulting in high bit error rates and/or exhibiting other shortcomings. Disclosed embodiments address the above-noted and other deficiencies by implementing a memory sub-system that employs block family based error avoidance strategies, thus significantly improving the bit error rate exhibited by the memory sub-system.

According to various embodiments, the temporal voltage shift is selectively tracked for a programmed set of memory cells grouped by block families, and appropriate voltage offsets, which are based on block affiliation with a certain block family, are applied to the base read levels in order to perform read operations. "Block family" herein shall refer to a possibly non-contiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family can be made with any granularity, containing only whole codewords, whole pages, whole superpages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

In creating a block family, variation in the temporal voltage shift can be significant between beginning to program data and closure of the block family. These effects can be magnified by inconsistent rates of programming across block families and by a relatively large time after program (TAP) until closing the block family. To illustrate, assume after 15 minutes of TAP, programmed data has a 14 millivolt (mV) shift in temporal voltage. Further assume that after 24 hours TAP, there is virtually no temporal voltage shift over a 15 minute window. Accordingly, by shrinking the size of a unit of trackable data in memory, the variation in temporal voltage shift for that trackable unit can be minimized, and thus assignment to a threshold voltage offset for performing read operations can be more relevant, e.g., yield lower read bit error (RBER) rates, for all pages of the trackable unit of memory.

More specifically, to minimize the temporal voltage shift between the beginning of programming and the end of programming a tracked unit of memory, the present embodiments partition programmed data into more granular units of data for purposes of tracking and assignment of threshold voltage offsets. These more granular units of data are referred to herein as a partition within of a set of pages of memory. Thus, the assignment of threshold voltage offsets to a block family can be further assigned at a block family and partition level for better RBER performance of assigned threshold voltage offsets.

In various embodiments, memory constraints, including the allocation of memory for storing the metadata that tracks partitions, suggest a selective approach to partitioning sets of pages. For example, the disclosed system and methods can further identify a subset of the sets of pages experiencing a variation in a measured value for a data state metric (such as TVS) that satisfies a threshold criterion. The system and method can therefore partition just the sets of pages that qualify according to this threshold criterion instead of partitioning each of the sets of pages being programmed to multiple dice of a memory device. Similarly, once a partitioned set of pages has reached a threshold TAP, the partitioning can be removed so that all pages of the set of pages are again treated equally for purposes of assignment to a threshold voltage offset bin and/or to threshold voltage offset values.

Different memory allocations schemes track different granular sizes of memory, where a common memory allocation is for a superblock, although other sets of pages or superpages can be allocated at different granularities other than a superblock. A superblock is a set of data blocks that span multiple dice that are written in an interleaved fashion. In some cases, a superblock spans all (or at least a subset of) the dice within a memory device. A superblock can contain multiple data blocks from a single die, such as one per plane. Drives may generally manage the erasure and programming of data on a superblock basis or other granularity of super-pages. A superpage is a page programmed to multiple dice as a lowest addressable unit of memory. For simplicity, "pages" as used herein should be understood to also make reference to "superpages" in a multi-dice system.

In various embodiments, a set of pages (e.g., a superblock, a group of blocks, a group of superpages, or the like) is partitioned to include a set of partitions, where each partition contains a certain number of pages, such as 18, 20, 24, 32, or the like number of pages. In one embodiment, each partition of the set of partitions is of a fixed length (or size), and thus the set of pages would include a fixed number of partitions. In another embodiment, each partition of the set of partitions is of a variable length (or size), and thus the set of pages could include a variable number of partitions. To limit the potential size of the set of pages, the partitioning can be limited to a maximum number of variable-length partitions.

In the various embodiments, once the set of pages is partitioned into a set of partitions, the set of partitions is programmed to the multiple dice of the memory device, and each partition is associated with the same (or a different) block family, and thus can be associated with the same (or a different) threshold voltage offset bin. Further, at least one bit is stored in a metadata table (or other memory tracking data structure for mapping block family and partitioned units to threshold voltage offsets) to indicate that the set of pages is partitioned. Other information helpful in mapping the block family and partition (whether fixed or variable in length) to threshold voltage offsets can also be stored in one or more metadata table as will be discussed in more detail.

Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Upon receiving a read command, the memory sub-system controller can identify the block family associated with the page or block identified by the logical block address (LBA) specified by the read operation, identify the threshold voltage offset bin associated with the block family and die on which the page or block resides, compute the new threshold voltage by additively applying the threshold voltage offset associated with the threshold voltage offset bin to the base read level, and perform the read operation using the new threshold voltage.

Therefore, advantages of the systems and methods implemented in accordance with some embodiments of the present disclosure include, but are not limited to, improving the bit error rate in read operations by maintaining metadata tracking groups of memory cells (e.g., partitions of sets of pages associated with block families) that are presumed to exhibit similar voltage distributions and selectively performing calibration operations for limited subsets of memory cells based on their block family and partition association. Further, because such tracking, storage, and calibration are performed on a partition and block family basis as opposed to a per-block (or per-page) basis, processing, memory, and storage resources are preserved for host system usage. Other advantages will be apparent to those skilled in the art of memory allocation and error optimization within a memory sub-system discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dice of the memory devices 130 (e.g., NAND type flash memory devices), such that the payload is distributed through a subset of dice, while the remaining one or more dice are used to store the error correction information (e.g., parity bits). Accordingly, a set of blocks distributed across a set of dice of a memory device using a striping scheme is referred herein to as a "super-block."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager 113 that can be used to implement the block family-based error avoidance strategies in accordance with embodiments of the present disclosure. In some embodiments, the controller 115 includes at least a portion of the block family manager 113. For example, the controller 115 can include a processor 117 (processing device) configured to execute instructions stored in local memory 119 for performing the operations described herein. In some embodiments, the block family manager 113 is part of the host system 120, an application, or an operating system. The block family manager 113 can manage block families associated with the memory devices 130, as described in more detail herein below.

Figure 2:
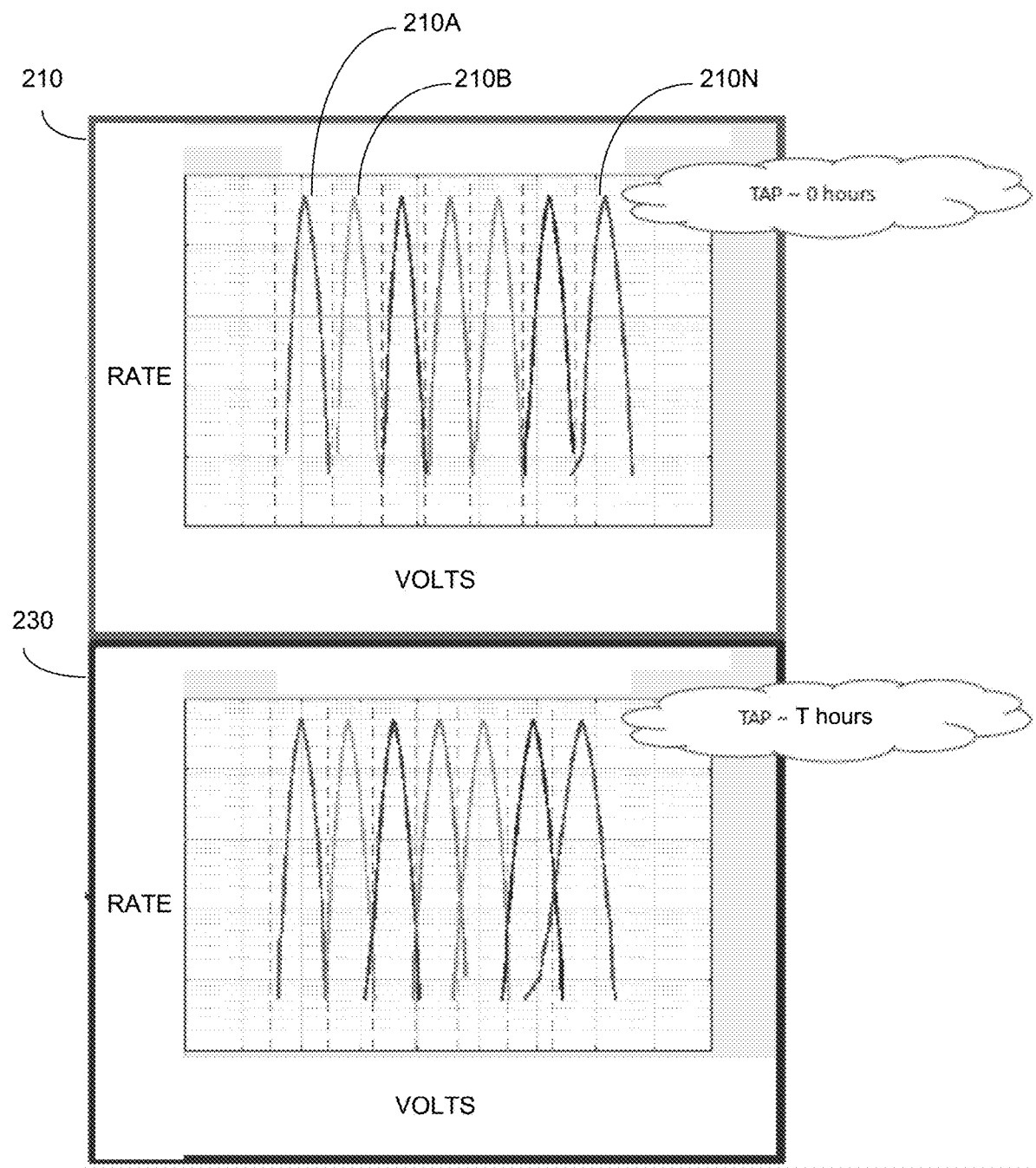
FIG. 2 is a set of graphs that illustrate a temporal voltage shift caused by the slow charge loss exhibited by triple-level memory cells, in accordance with some embodiments.

FIG. 2 is a set of graphs that illustrate a temporal voltage shift caused by the slow charge loss exhibited by triple-level memory cells, in accordance with some embodiments. While the illustrative example of FIG. 2 utilizes triple-level cells, the same observations can be made and, accordingly, the same remedial measures are applicable to single level cells and multi-level cells in order to compensate for the slow charge loss.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph illustrates a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

The set of a graphs include a first graph 210 that reflects a time period immediately after programming and a second graph 230 that reflects a long time after programming. As seen by comparing the second graph 230 to the first graph 210, the voltage distributions change in time due to the slow charge loss, which results in drifting values of the threshold voltage levels (shown by dashed vertical lines). In various embodiments, this temporal voltage shift (TVS) is selectively tracked for programmed pages or blocks grouped by block families, and appropriate voltage offsets, which are based on page or block affiliation with a certain block family, are applied to the base read levels in order to perform read operations.

Figure 3:
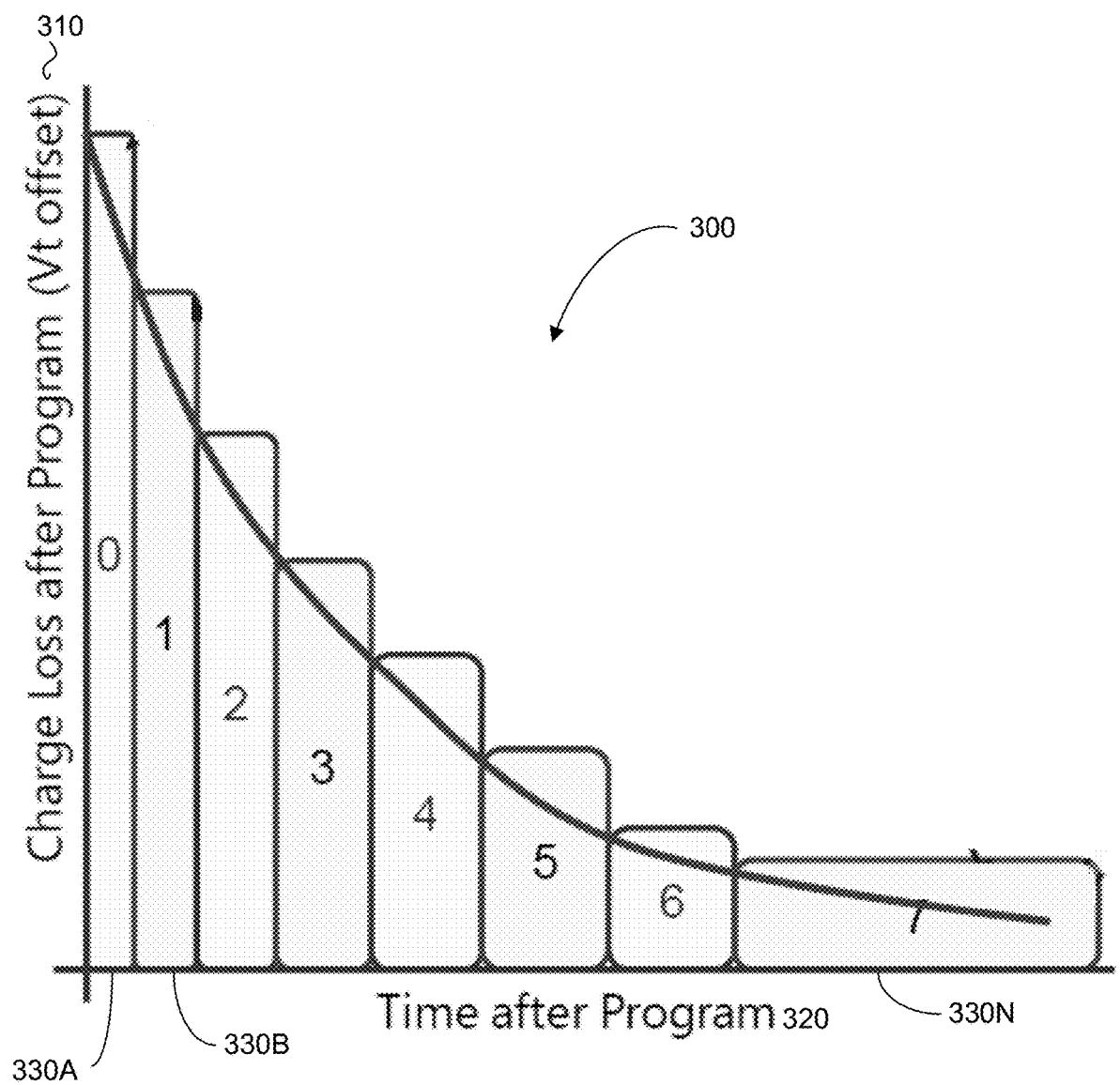
FIG. 3 is an example graph illustrating the dependency of a threshold voltage offset on the time after program, e.g., the period of time elapsed since the a page had been programmed, in accordance with some embodiments.

FIG. 3 is an example graph 300 illustrating the dependency of a threshold voltage offset 310 on the time after program 320, e.g., the period of time elapsed since a page had been programmed, in accordance with some embodiments. As schematically illustrated by FIG. 3, page or blocks (or groups of memory cells at another granularity) of the memory device are grouped into block families 330A-330N, such that each block family includes one or more pages or blocks that have been programmed within a specified time window, potentially varied by average temperature while the block family is open. As noted herein above, since the time elapsed after programming and temperature are the main factors affecting the temporal voltage shift, all pages, blocks, and/or partitions within a single block family are presumed to exhibit similar distributions of threshold voltages in memory cells, and thus would require the same voltage offsets for read operations as time passes.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family, which time period can vary significantly depending on an average temperature associated with pages during programming. More specifically, the entire asymptotic curve illustrated in FIG. 3 can be shifted to have a steeper curve with respect to time as average temperature increases.

A newly created block family can be associated with bin 0, and each subsequently created block family can be associated with a sequentially numbered block family. Then, the memory sub-system controller can periodically perform a calibration process in order to associate each die of every block family with one of the predefined threshold voltage offset bins (e.g., bins 0-7 in the illustrative example of FIG. 3), which is in turn associated with the threshold voltage offsets to be applied for read operations. The association of pages, blocks, and/or partitions with block families and block families and dice with threshold voltage offset bins can be stored in respective metadata tables maintained by the memory sub-system controller 115.

Figure 4:
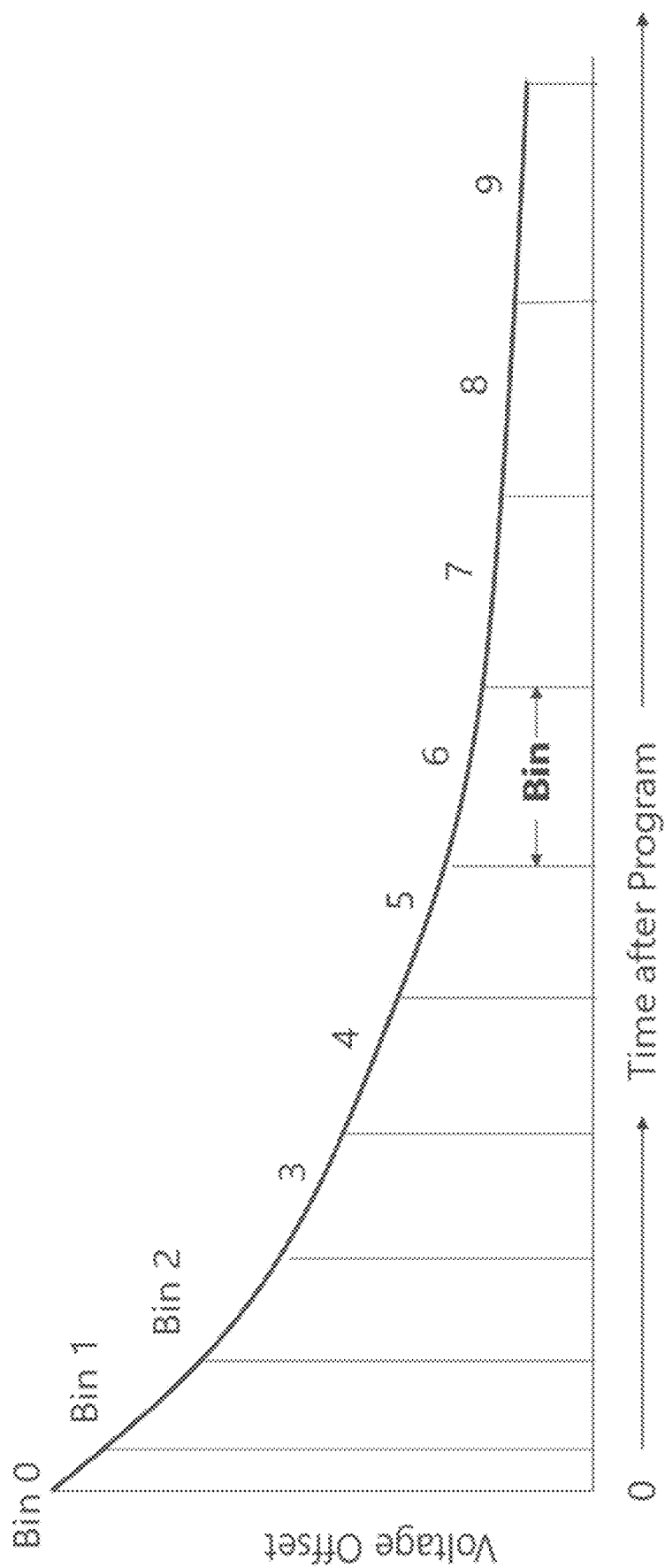
FIG. 4 is a graph that illustrates a set of predefined threshold voltage offset bins, in accordance with embodiments.

FIG. 4 is a graph that illustrates a set of predefined threshold voltage offset bins (bin 0 to bin 9), in accordance with some embodiments. As schematically illustrated by FIG. 4, the threshold voltage offset graph can be subdivided into multiple threshold voltage offset bins, such that each bin corresponds to a predetermined range of threshold voltage offsets. While the illustrative example of FIG. 4 defines ten bins, in other implementations, various other numbers of bins can be employed (e.g., 16, 32, 64 bins). Based on a periodically performed calibration process, the memory sub-system controller 115 can associate each die of every block family with a threshold voltage offset bin, which defines a set of threshold voltage offsets to be applied to the base voltage read level in order to perform read operations.

Figure 5:
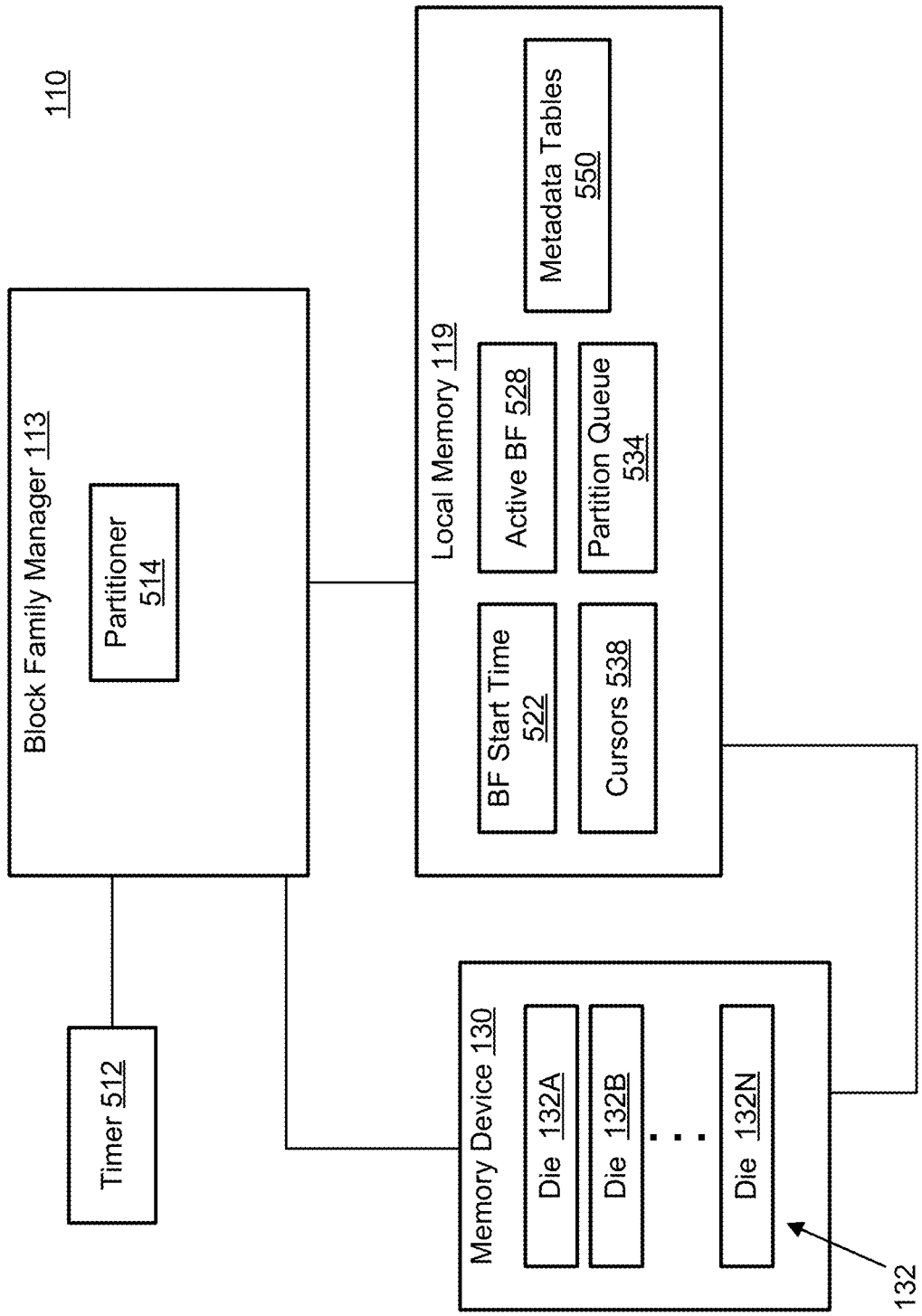
FIG. 5 is a block diagram that illustrates operation of a block family manager within the memory sub-system controller of FIG. 1 in accordance with various embodiments.

FIG. 5 is a block diagram that illustrates operation of the block family manager 113 within the memory sub-system controller 115 of FIG. 1 in accordance with various embodiments. The memory sub-system can include a timer 512, which can be located in the controller 115, such as within the processor 117 or the block family manager 113 in different embodiments. The memory device 130 can include multiple dice 132, including a first die 132A, a second die 132B, . . . to include an Nth die 132N. The block family manager 113 can include a partitioner 514, which is adapted to partition sets of pages (like superblocks) into sets of partitions before programming the sets of pages to the multiple dice 132 of the memory device 130. The local memory 119 can store a number of different items of information or data that will be discussed in more detail, including but not limited to, a block family (BF) start time 522, an active block family (BF) identifier 528, a partition queue 534, cursors 538 associated with the memory device 130, and a set of metadata tables 550. This information and data can be flushed to the memory device 130 (or other non-volatile memory) in response to detection of an imminent loss of power.

In various embodiments, logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), block family information, and the like. Additional metadata can be further associated with block families that include partitioning information as will be discussed with reference to the metadata tables 550.

In various embodiments, the block family manager 113 can open a new block family after a previously opened block family has been closed. At initiation of each block family, the block family manager 113 can initialize the timer 512 associated with a system clock. The system clock, for example, can be a clock maintained by the memory sub-system 110 and/or the host system 120. The time at which the block family is opened on the system clock can be stored as the BF start time 522. The value of the timer 512 can then track time after program (TAP) for the set of pages that are partitioned into a set of partitions. The block family manager 113 can further, using one or more of the temperature sensor(s), measure an opening temperature of the memory device 130. This opening temperature can be stored in the local memory 119, such as with values of the temperature metrics. A change in temperature or an aggregation of temperature change can be tracked over time and incorporated into algorithmic determination of whether some partitions should be associated with different threshold voltage offset bins. This determination can be combined with TAP to determine how long to keep a block family open.

The block family currently being programmed can be referred to as the active block family for which the active BF identifier 528 can be stored in the local memory 119 and utilized as the index for the metadata tables 550. For ease of tracking, each subsequently programmed block family can be assigned a sequentially numbered BF identifier, but other sequences and identifiers can also be used. Similarly, each partition of the set of partitions created may be assigned a sequentially numbered partition number. The blocks families can also be associated with one or more of the cursors 538, e.g., at least an opening cursor and a closing cursor for each BF. "Cursor" herein shall broadly refer to a location on the memory device to which the data is being written.

In various embodiments, the partitioner 514 is adapted to partition sets of pages in sets of partitions as each set of pages is programmed to the multiple dice 132 of the memory device 130. As discussed, each set of pages may be a superblock, a group of blocks, a group of superpages, or some other granularity of trackable memory units programmed to the multiple dice 132. The partitioner 514 can further limit the number of logical units (LUN) or other trackable memory unit for each partition, e.g., to 18, 20, 24, 32, or the like number of pages. In this way, the TAP and variation in temperature is lessened for each partition between starting to program the partition and ending programming the partition. Further, each partition can be associated with the same or a different block family and the same or a different threshold voltage offset bin, thus providing more granular assignment of a partition to a set of threshold voltage offset values to be applied to a base read level when performing a read operation.

In some embodiments, a data state metric that can be measured at the memory cells of the set of pages can aid in defining a size of each partition. A data state metric, such as temporal voltage shift (TVS), can be a quantity that is measured or inferred from the behavior of data within the memory cells of the block family that provides insight into the voltage state of the data. Thus, the data state metric can indicate the state of TVS, a valley location of a fifth voltage level distribution, a median voltage at a seventh voltage level distribution, a degree of read disturb, the number of error bits measured in response to a read operation at a particular read level, or the like value. Reference to the TVS (or data state metric) value along with TAP, change in temperature, and/or program erase cycles can specify how large each partition should be to keep RBER of assigned threshold voltage offset values below an acceptable threshold RBER level. Accordingly, the block family manager 113 can determine a data state metric value representative of the set of pages being partitioned. The block family manager can further set a length (or size) of each partition of the set of partitions such as to keep RBER level associated with the data state metric value below a threshold RBER value.

In some embodiments, however, if the cursor controlled by the controller 115 does not finish writing a partition within a threshold allowed time (e.g., associated with filling a partition of a fixed or variable size), the controller 115 can pad a remaining portion of the partition with dummy data such as a randomized pattern data or other dummy data. Thus, in response to determining that at least a specified period of time elapses before a partition of the set of partitions has been fully programmed, the controller 115 can write the randomized pattern data to fully program the partition and associate the partition with a block family.

Figure 6:
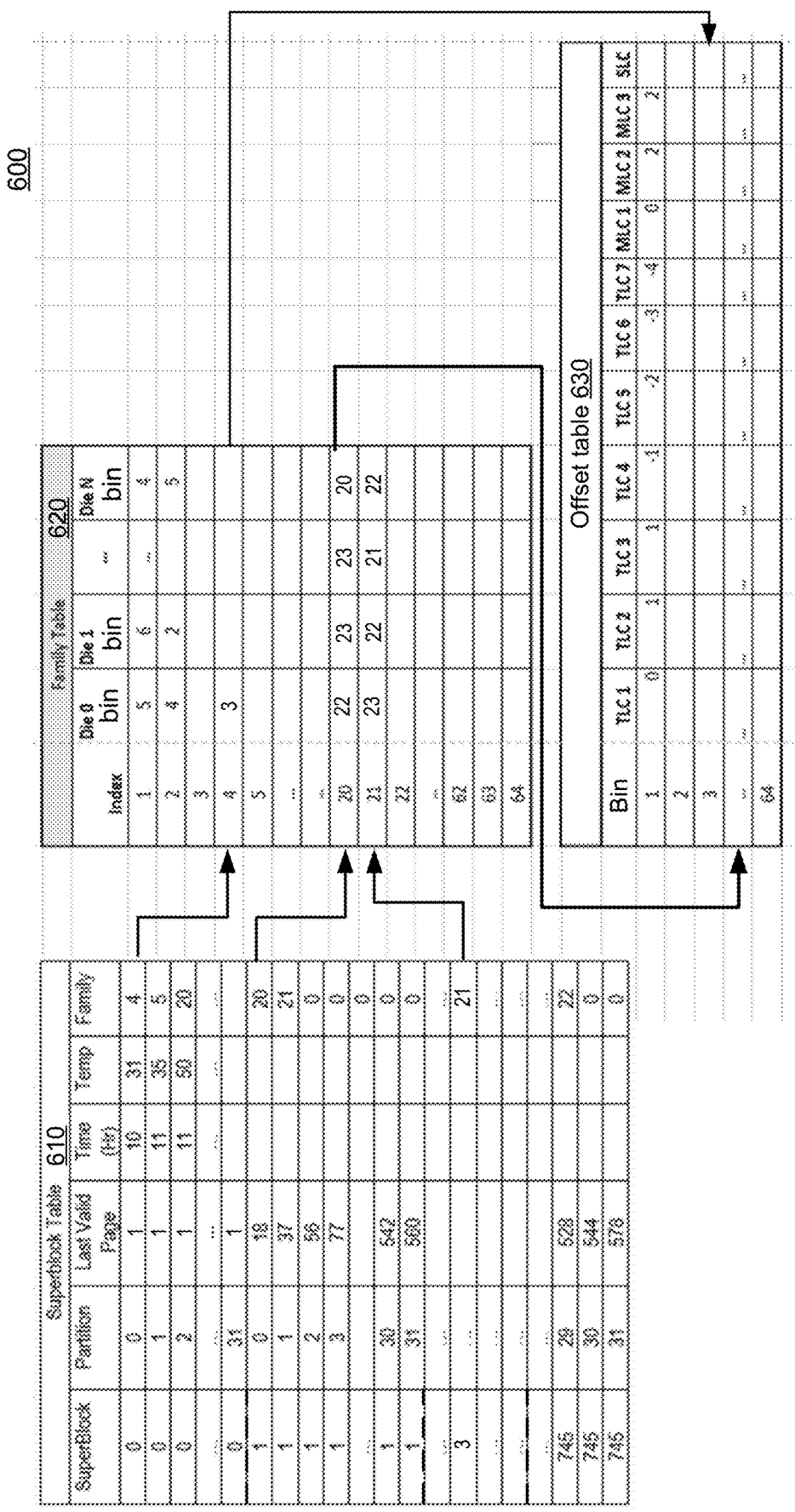
FIG. 6 is a graph that schematically illustrates metadata maintained by the memory sub-system controller operating in according with some embodiments.

FIG. 6 is a graph 600 that schematically illustrates metadata maintained by the memory sub-system controller 115 operating in according with some embodiments. The metadata can be maintained for associating LUNs (e.g., blocks) or partial LUNs (e.g., codewords or pages) with partitions and block families. As schematically illustrated by FIG. 6, the memory sub-system controller 115 can maintain a superblock table 610, a block family table 620, and a bin offset table 630 of the metadata tables 550. Each record of the superblock table 610 specifies the block family associated with the specified superblock and partition combination. In some implementations, records of the superblock table 610 can further include time and temperature values associated with the specified superblock and partition combination.

In disclosed embodiments, each record also includes a "Last Valid Page" field that can store a value indicating, to the controller 115, whether the partition is fixed length or variable length. If the last valid page field is empty (e.g., no value is stored), the associated set of pages is not partitioned. Further, the partition is fixed length if the last valid page value is less than a threshold value (such as eighth, nine, ten, fifteen, or the like) and thus a smaller value that can be associated with a fixed length. For example, a "0" can be a length of 18 superpages, a "10" can be a length of 20 superpages, a "11" can be a length of 24 superpages, a "110" can be a length of 28 superpages, and a "111" can be a length of 32 superpages, or the like. In an alternative embodiment, the size of the fixed length is stored as a value outside of the superblock table 610, e.g., elsewhere in the local memory 119.

In these embodiments, the partition is variable length if the last valid page value is greater than or equal to the threshold value just discussed, and the controller 115 tags the variable-length partition by storing the address for the last valid page in the last valid page field of the record. This means that the controller 115 can read the last valid page as the last page of the variable-length partition. Knowing the address of the last valid page helps the controller 115 (or block family manager 113) to determine, based on a logical block address (LBA) in a read operation and the original cursor value for the set of pages, to which variable-length partition the LBA is pointing. Alternatively, the controller 115 can calculate the size of the variable-length partition based on the difference between the last valid page address of two sequentially-written partitions. Once a set of pages (e.g., superblock or other granularity of set of pages) is identified, the partition is identified, and time and temperature values accounted for, the superblock table 610 can be used to identify the block family with which the superblock/partition is associated. The block family is in the last field of the record in the example superblock table 610 of FIG. 6.

In an alternative embodiment, instead of the address of the last valid page, the controller can store, in the last valid page field of the superblock table 610, the size of the variable-length partition. The particular partition can then be calculated based on the lengths (or sizes) of respective partitions that are stored sequentially to the memory device 130 from the cursor location. For cursors that do not use all of the maximum number of variable-length partitions, the controller 115 can store the number of partitions used and only perform the binary search (e.g., searching) for a variable-length partition within the valid variable-length partitions.

In various embodiments, memory constraints, including the allocation of memory for the superblock table 610 that tracks partitions, suggest a selective approach to partitioning sets of pages. For example, the disclosed system and methods can further identify a subset of the sets of pages experiencing a variation in a data state metric (such as TVS) that satisfies a threshold criterion. This identification of the subset can be based on those of the sets of pages that take more than a threshold time period to completely program, thus resulting in a variation in a value measured for the data state metric over the threshold criterion. In various embodiments, this threshold criterion determination is made based on workload, memory operation scheduling, and/or amount of data projected to be written to a given set of pages. The system and method can, in this way, partition just the sets of pages that qualify instead of partitioning each of the sets of pages being programmed to the multiple dice 132.

In one embodiment, with additional reference to FIG. 5, the partitioner 514 partitions each set of pages (such as a superblock) of the subset into a set number of fixed-length partitions, where each partition is a numbered portion of the set of pages. The partitioner 514 further stores at least one bit value in one of the metadata tables 550 (e.g., the superblock table 610) indicative of a fixed length. For example, the bit value can be a "0" or a "1" or the like associated with the partition (or in association with the first partition of the set of pages) that indicates that the partitioner 514 should use a default size for each partition. That default size could change with different values of the at least one bit, as was discussed above. With additional reference to FIG. 6, the at least one bit is a "1" for superblock 0 in the last valid page column of a superblock table 610, by way of example.

Then, when receiving a read operation directed at a page of the set of pages (e.g., superblock) that was partitioned with a fixed-length partition, the controller 115 (or block family manager 113) can determine, based on a logical block address specified by the read operation and the value indicative of the fixed length, a partition of the set of partitions to which the read operation corresponds. In the example illustrated in FIG. 6, the address is to a page or block of superblock 0. Knowing the fixed size of the partitions (e.g., that corresponds to a "1" value), a mathematical calculation leads to determining the partition associated with the page or block of the address (e.g., LBA) within superblock 0. In the example of FIG. 6, the partition is resolved to be partition "0." The controller 115 can further perform searching, using a first value associated with the superblock (e.g., "0" in this case) and a second value associated with the partition (e.g., assume also "0" in this case), the superblock table 610 to identify a block family (e.g., block family "4") to which the partition is assigned.

In another embodiment, with additional reference to FIG. 5, the partitioner 514 partitions the set of pages (such as a superblock) into a maximum number of variable-length partitions, where each variable-length partition is a numbered portion of the set of pages. The partitioner 514 further stores in one of the metadata tables 550 (e.g., the superblock table 610) an address of the last valid page that was written for each numbered portion of the set of pages. Thus, by way of example, when programming superblock 1, the superblock table 610 illustrates that each partition 0 through 31 of superblock 1 has a different number offset (although some can be the same or similar to each other), e.g., address 18 for partition 0, address 37 for partition 1, address 56 for partition 2, address 77 for partition 3, and so forth.

In this variable-length embodiment, when receiving a read operation directed at a page of the set of pages (e.g., superblock) that was partitioned, the controller 115 (or block family manager 113) can search through the multiple last valid pages of the metadata table 550 (e.g., the superblock table 610) to determine a partition of the set of partitions corresponding to a logical block address of the read operation. For example, if the LBA corresponds to superblock and the LBA resolves to a last valid page of 18, then the superblock table 610 returns a partition number of 0. The controller 115 can further search, using a first value associated with the superblock and a second value associated with the partition, the metadata table (e.g., the superblock table 610) to identify a block family to which the partition is assigned. The block family identified in the example of FIG. 6 is block family 20.

In related embodiments, the partitioner 514 can track time after program (TAP) for the partitioned sets of pages or superblocks. For example, only the most recently written pages remain partitioned. Once a set of pages has reached a threshold TAP (e.g., 18 hours, 20 hours, 22 hour or the like), the partitioning of the set of pages can be removed so that all pages of the set of pages are again treated equally for purposes of assignment to a threshold voltage offset bin and/or to threshold voltage offset values. The threshold TAP can be set generally at the TAP where the TVS levels out for the die(s). The partitioner 514 can remove partitioning by, for example, removing the at least one bit (or bit value) from the metadata table 550 for the set of pages in response to the set of pages reaching a threshold time after program (TAP). Removing these value(s) signals to the processing logic of the partitioner 514 thereafter that the set of pages is no longer partitioned. The removed information could be a bit value that indicates the partitions are fixed in length or the address of the last valid page stored for the partitions that are variable in length, for example. The partitioner 514 can further remove other metadata that tracks per-partition allocation to the threshold voltage offset bins.

In an alternative embodiment, the partitioning is removed in response to the set of pages exiting the partition queue 534 of a threshold number of the sets of pages that are to remain partitioned. The partition queue 534 could therefore be a first-in-first-out (FIFO) or similar queue that tracks just a threshold number of the sets of pages, e.g., 10, 15, 20, or the like sets of pages. This threshold number of the sets of pages can be chosen based on an estimation that sets of pages exiting the partition queue 534 have met the threshold TAP discussed previously. When an identifier of a set of pages exits the partition queue 534, the partitioner 514 can remove any partition-indicating values stored in the record of the superblock table 610 for that set of pages indexed within the metadata tables 550. In these ways, the partitioner 514 can determine when partitions of a partitioned set of pages have TVS or other data state metric calibrations that are substantially similar and are no longer needed to be partitioned. The partitioner 514 can also remove indications of partitioning from the metadata in the superblock table 610.

In various embodiments, removing partitioning (or merging partitions of a set of pages) can result in the partitioner 514 choosing the same block family for the merged set of pages. In one embodiment, the block family manager 113 selects an existing block family associated with the previously partitioned sets of pages. In one example, the block family is the oldest block family previously assigned any one of the partitions, but can be a middle-aged block family in terms of TAP, or some different block family assignment best representative of threshold voltage shift (TVS) for the merged set of pages. The partitioner 514 can then update the superblock table 610, for example, to consolidate a single entry for the merged set of pages. The single entry is associated with a block family, for example, in the value of the last column of the entry. The entry for superblock 3 in FIG. 6 is an example, e.g., which associated with block family 21. The entry contains a pointer to Index 21 associated with block family 21.

In further embodiments, the partitioner 514 partitions the set of pages (e.g., superblock) into the set of partitions that includes a variable number of fixed-length and variable-length partitions. The partitioner 514 can further store a value identifying each variable-length partition in an array with a multiple-linked list structure of tracking the variable-length partitions. The fixed-length partitions will be predictably tracked within or on either side of variable-length partitions by way of knowing the size of each fixed-length partition.

Furthermore, a threshold voltage offset calculator of the block family manager 113 can access the metadata tables 550 to determine which threshold voltage offset bin should be used for a particular read. As discussed with reference to FIGS. 3-4, as the TVS value for a BF shifts with increasing slow charge loss, the BF will be read with reference to bins with larger voltage offset values. These larger voltage offset values can come from higher-numbered bins, for example.

With additional reference to FIG. 6, the block family table 620 is indexed by the block family number (or a block family identifier), such that each record of the block family table 620 specifies, for the block family referenced by the index of the record in the superblock table 610, a set of threshold voltage offset bins (e.g., bin pointers) associated with respective dice of the block family. In other words, each record of the block family table 620 includes a vector, each element of which specifies the threshold voltage offset bin associated with the die referenced by the index of the vector element. In one embodiment, all the dice of multiple dice 132 in the memory device 130 point to a single bin. The threshold voltage offset bins to be associated with the block family dice can be determined by the calibration process, as described in more detail herein. Further, the bin offset table 630 is indexed by the bin number. Each record of the bin offset table 630 specifies a set of threshold voltage offsets (e.g., for TLC, MLC, and/or SLC) associated with threshold voltage offset bin.

The metadata tables 610-630 can be stored on one or more memory devices 130 of FIG. 1. In some implementations, at least part of the metadata tables 610-630 can be cached in the local memory 119 of the memory sub-system controller 115 of FIG. 1, e.g., as part of the metadata tables 550 (FIG. 5).

In operation, upon receiving a read command, the memory sub-system controller determines the physical address corresponding to the logical block address (LBA) specified by the read command. Components of the physical address, such as the physical block number and the die identifier, are utilized for performing the metadata table walk. For example, the superblock table 610 is first used to identify the block family identifier corresponding to the physical block number, as was discussed above. Next, the block family identifier is used as the index to the block family table 620 in order to determine the threshold voltage offset bin associated with the block family and the die. Finally, the identified threshold voltage offset bin is used as the index to the bin offset table 630 in order to determine one or more threshold voltage offsets corresponding to the identified threshold voltage offset bin. The memory sub-system controller 115 can then additively apply the identified threshold voltage offset to the base voltage read level for each voltage level read distribution in order to perform the requested read operation.

In the illustrative example of FIG. 6, the superblock table 610 maps partition 0 of the superblock 0 to block family 4, which is utilized as the index to the block family table 620 in order to determine that, for block family 4, die 0 is mapped to bin 3. The latter value is used as the index to the bin offset table 630 in order to determine the threshold voltage offset values for bin 3. This was the above example of the fixed-length partition.

In a further illustrative example of FIG. 6, the superblock table 610 maps partition 0 of superblock 1 to block family 20, which is utilized as the index to the block family table 620 in order to determine that, for block family 20, die 0 is mapped to bin 22. The latter value is used as the index to the bin offset table 630 in order to determine the threshold voltage offset values for bin 22. This was the above example of the fixed-length partition. Not all values likely contained in the metadata tables 610-630 are illustrated for simplified illustration.

Figure 7:
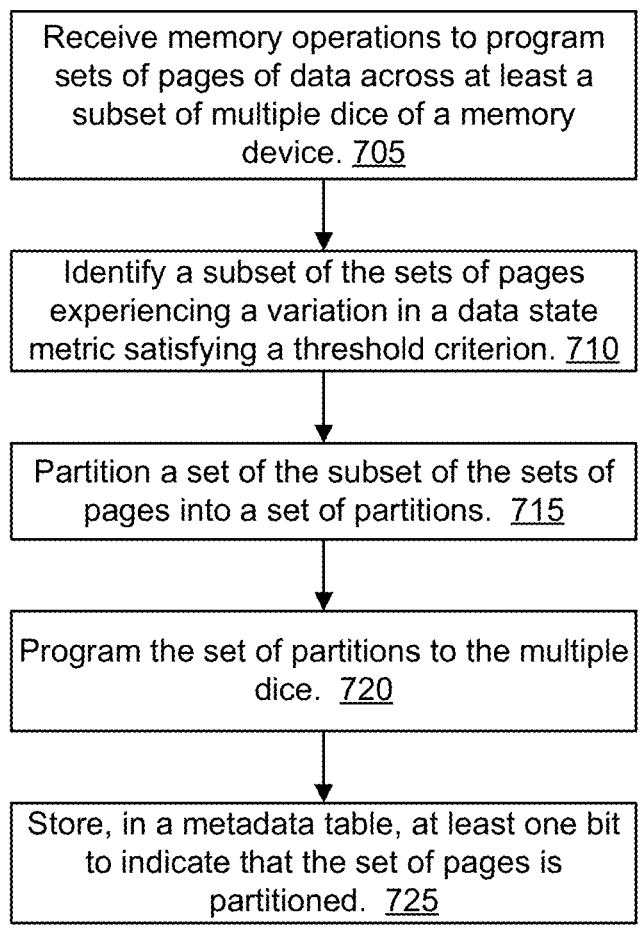
FIG. 7 is a flow diagram of an example method for selective partitioning of sets of pages programmed to a memory device, in accordance with some embodiments.

FIG. 7 is a flow diagram of an example method 700 for selective partitioning of sets of pages programmed to a memory device, in accordance with some embodiments. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 705, the processing logic receives a memory operation to program a set of pages of data across at least a subset of the multiple dice 132 of the memory device 130. The memory operation can be a write operation. In one embodiment, the multiple dice 132 are all of the dice of the memory device 130.

At operation 710, the processing logic identifies a subset (e.g., a plurality) of the sets of pages experiencing a variation in a data state metric satisfying a threshold criterion. This identifying can include determining that the subset of the sets of pages takes more than a threshold time period to completely program. The data state metric can be a quantity that is measured or inferred from the behavior of data within the memory cells of the block family that provides insight into the voltage state of the data. Thus, the data state metric can indicate the state of TVS, a $5^{th}$ valley location, a $7^{th}$ distribution median voltage, a degree of read disturb, the number of error bits measured using a particular read level, or the like value.

At operation 715, the processing logic partitions a first set of pages of the subset of the sets of pages into a set of partitions. At operation 720, the processing logic programs the set of partitions to the multiple dice 132.

At operation 725, the processing logic stores, in a metadata table 550, at least one bit to indicate that the set of pages is partitioned. In one embodiment, the metadata table 550 is the superblock table 610. For a set of fixed-length partitions, the at least one bit can have a value that is below a threshold value and thus indicative of referencing a fixed length. In another embodiment, for a set of variable-length partitions, the at least one bit can have a value that is greater than or equal to the threshold value and thus indicative of referencing a variable length.

Once the set of pages is partitioned, the processing logic can further associate a first partition of the set of partitions with a first block family and assign the first block family to a first threshold voltage offset bin. The processing logic can further associate a subsequent partition of the set of partitions with a second block family and assign the second block family to a second threshold voltage offset bin. In this way, each more granular partition of the set of pages is separately assignment to a different threshold voltage offset bin, and thus a different set of threshold voltage offset values. In an extension of the method 700, the processing logic can further partition, into a further set of partitions, each set of pages of the subset of the sets of pages in addition to the first set of pages and further program each further set of partitions to the multiple dice 132.

Figure 8:
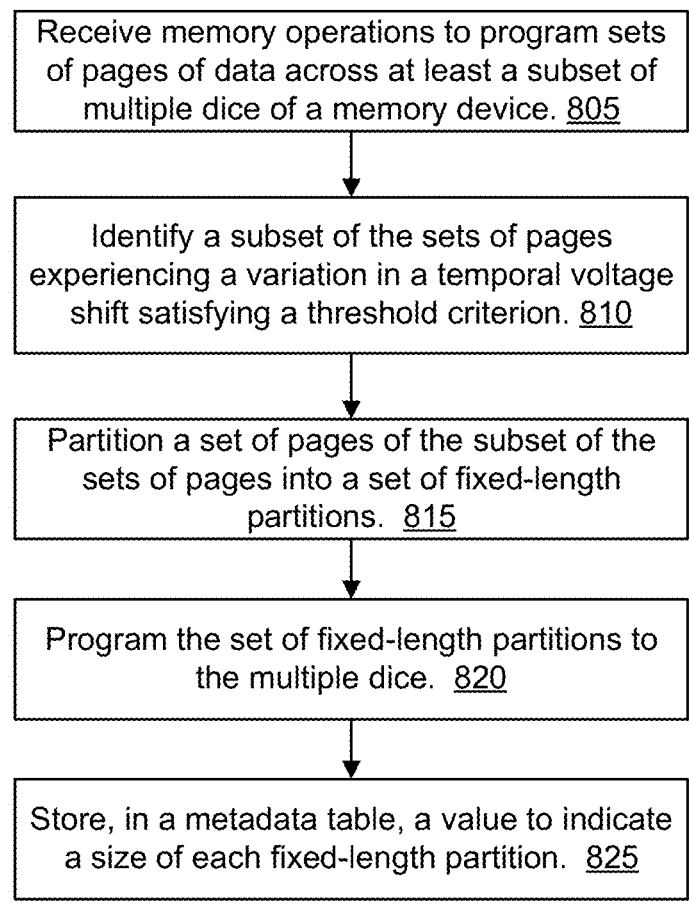
FIG. 8 is a flow diagram of an example method of selective partitioning of sets of pages programmed to a memory device, in accordance with another embodiment.

FIG. 8 is a flow diagram of an example method 800 for selective partitioning of sets of pages programmed to a memory device, in accordance with another embodiment. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 805, the processing logic receives a memory operation to program a set of pages of data across at least a subset of the multiple dice 132 of the memory device 130. The memory operation can be a write operation. In one embodiment, the multiple dice 132 are all of the dice of the memory device 130.

At operation 810, the processing logic identifies a subset (e.g., a plurality) of the sets of pages experiencing a variation in temporal voltage shift (TVS) satisfying a threshold criterion. This identifying can include determining that the subset of the sets of pages takes more than a threshold time period to completely program, e.g., over 1 hour, 2 hours, 3 hours, or some other fixed number of hours of half hours. The longer it takes to program a set of pages, the more likely the variation in TVS will be unacceptably large.

At operation 815, the processing logic partitions a first set of pages of the subset of the set of pages into a set of fixed-length partitions, wherein each fixed-length partition is a numbered sub-group of the set of pages. At operation 820, the processing logic programs the set of fixed-length partitions to the multiple dice 132.

At operation 825, the processing logic stores, in a metadata table 550, a value to indicate a size of each fixed-length partition. In one embodiment, the metadata table 550 is the superblock table 610. The value can be below a threshold value and thus indicative of referencing a fixed length. In an extension of the method 800, the processing logic can further partition, into a further set of fixed-length partitions, each set of pages of the subset of the sets of pages in addition to the first set of pages and further program each further set of fixed-length partitions to the multiple dice 132.

Figure 9:
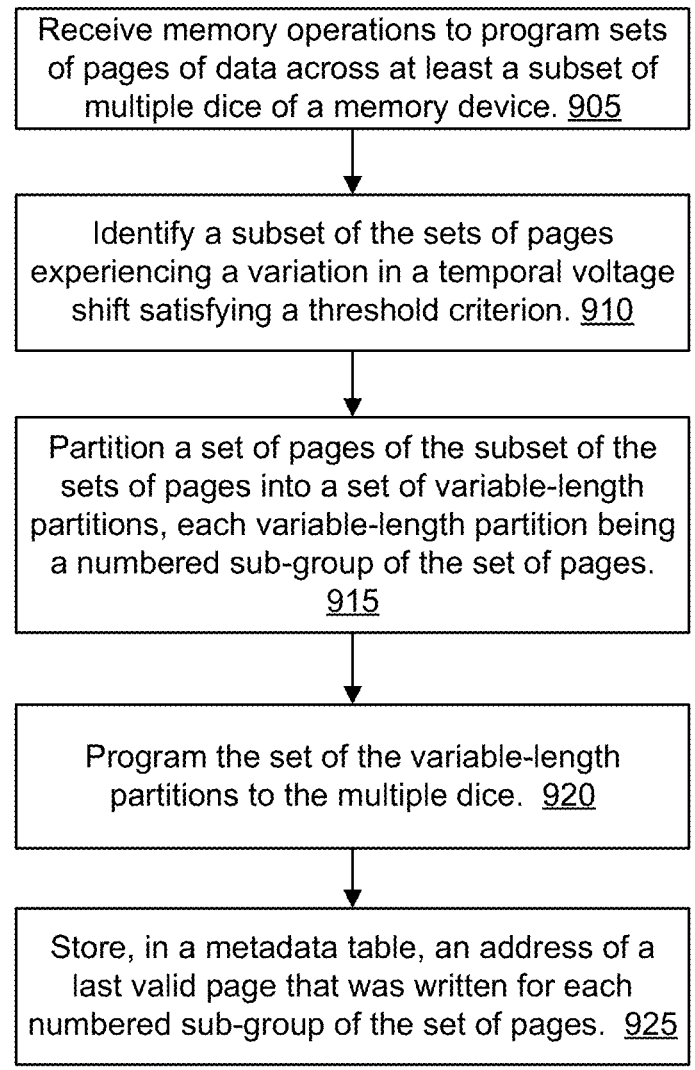
FIG. 9 is a flow diagram of an example method for selective partitioning of sets of pages programmed to a memory device, according to a further embodiment.

FIG. 9 is a flow diagram of an example method 900 for selective partitioning of sets of pages programmed to a memory device, according to a further embodiment. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 905, the processing logic receives a memory operation to program a set of pages of data across at least a subset of multiple dice of the memory device. The memory operation can be a write operation. In one embodiment, the multiple dice 132 are all of the dice of the memory device 130.

At operation 910, the processing logic identifies a subset (e.g., a plurality) of the sets of pages that are to undergo a variation in temporal voltage shift satisfying a threshold criterion. This identifying can include determining that the subset of the sets of pages takes more than a threshold time period to completely program, e.g., over 1 hour, 2 hours, 3 hours, or some other fixed number of hours of half hours. The longer it takes to program a set of pages, the more likely the variation in TVS will be unacceptably large.

At operation 915, the processing logic partitions a first set of pages of the subset of the sets of pages into a set of variable-length partitions, wherein each variable-length partition is a numbered sub-group of the set of pages. At operation 920, the processing logic programs the set of variable-length partitions to the multiple dice 132.

At operation 925, the processing logic stores, in a metadata table 550, an address of a last valid page that was written for each numbered sub-group of the set of pages. In one embodiment, the metadata table 550 is the superblock table 610. The address of the last valid page for each partition can be stored in the last valid page field or another field of the superblock table. In an extension of the method 900, the processing logic can further partition, into a further set of variable-length partitions, each set of pages of the subset of the sets of pages in addition to the first set of pages and further program each further set of partitions to the multiple dice 132.

Figure 10:
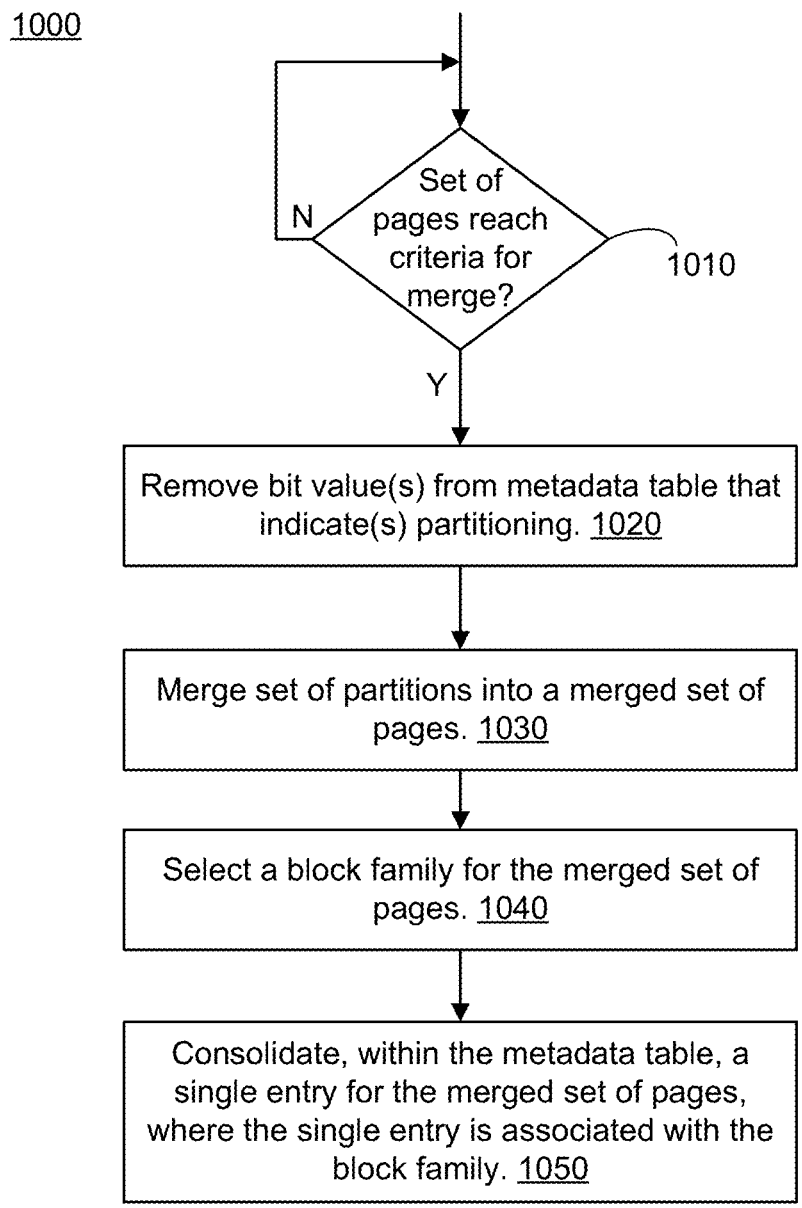
FIG. 10 is a flow diagram of an example method for merging a partitioned set of pages according to an embodiment.

FIG. 10 is a flow diagram of an example method 1000 for merging a partitioned set of pages according to an embodiment. The method 1000 can be applicable to merging a set of partitions, whether fixed-length or variable-length partitions. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1010, the processing logic determines whether the set of pages (or set of partitions of the set of pages) has reached a criteria for merging the set of partitions. These criteria have been discussed, and include, for example, the set of pages reaching a threshold TAP, an identifier for the set of pages has exited a queue that holds a threshold number of the sets of pages that are to remain partitioned, or the set of partitions are assigned to an identical threshold voltage offset bin. Any one of these criteria indicate that the value of separately assigning a threshold voltage offset bin to different partitions of the set of pages is diminished to the point that tracking individual partitions within metadata no longer has merit. Additional criteria are envisioned that can involve, for example, tracking or measuring TVS values of the partitions.

At operation 1020, the processing logic removes one or more bit value(s) from the metadata table (e.g., the superblock table 610) that indicate(s) the set of pages is partitioned. In this way, the metadata table will no longer signal to the processing logic that the set of pages is partitioned.

At operation 1030, the processing logic merges the set of partitions into a merged set of pages. In one embodiment, this merging returns the set of partitions to being tracked as an individual memory unit, such as a superblock in the example of FIG. 6.

At operation 1040, the selecting a block family for the merged set of pages. In one embodiment, the selected block family is the oldest block family (having the largest TAP) previously assigned any one of the partitions for the set of pages. In another embodiment, a block family that is of median age is selected as most representative for purposes of association with a threshold voltage offset bin. Other algorithmic approaches such as averaging TAP, for example, are envisioned that also result in association of the merged set of pages with a block family that was or was not previously assigned to one or more of the partitions.

At operation 1050, the processing logic consolidates, within the metadata table, a single entry for the merged set of pages. The single entry is associated with the selected block family, such as by way of a value stored within the record for the merged set of pages illustrated in superblock table 610 of FIG. 6. In this way, the remaining entry in the metadata table after merging the partitions is already associated with the block family and has an appropriate pointer into the block family table 620 that assigns the threshold voltage offset bin and die number to the entry.

Figure 11:
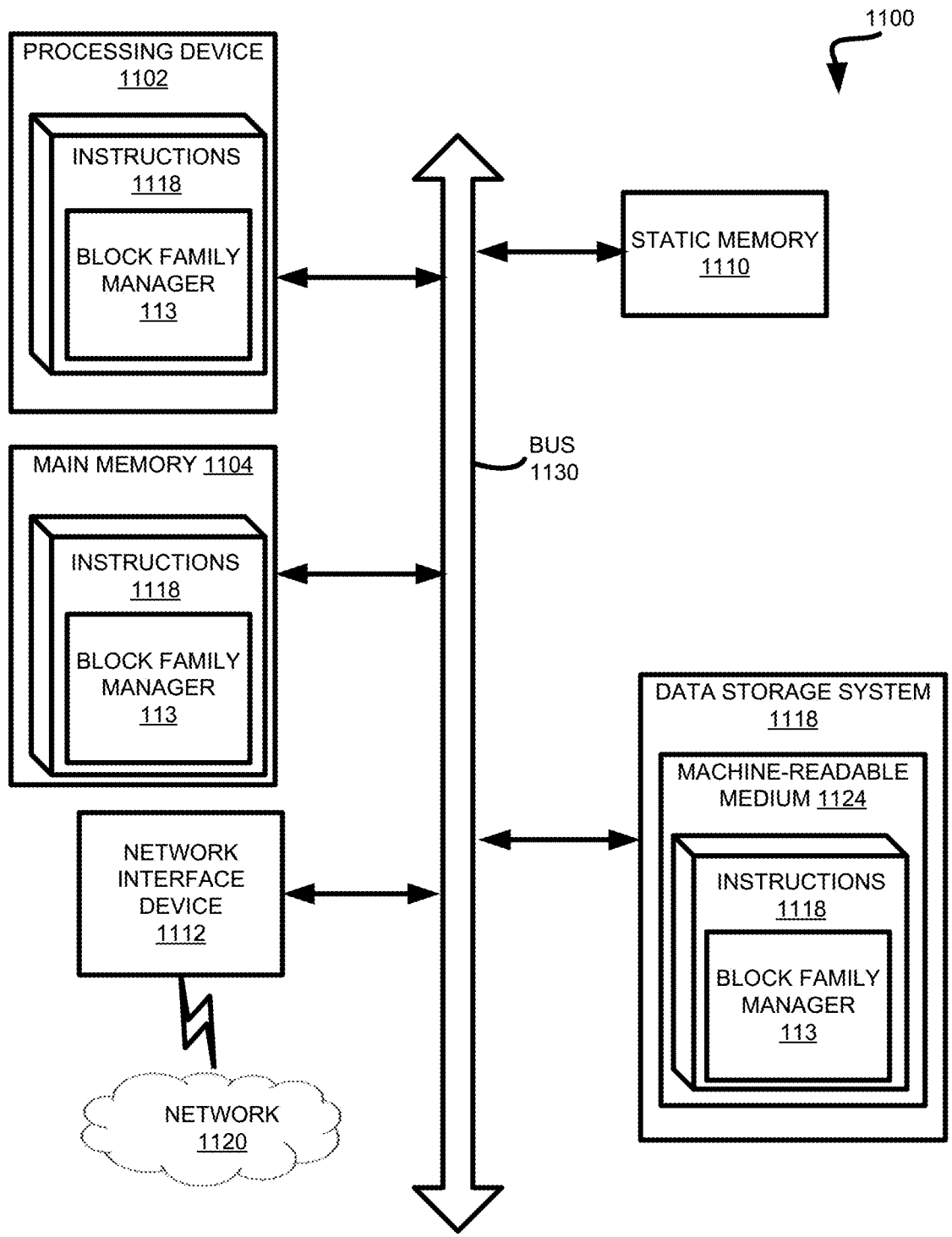
FIG. 11 is a block diagram of an example computer system in which embodiments of the present disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1110 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1128 for performing the operations and steps discussed herein. The computer system 1100 can further include a network interface device 1112 to communicate over the network 1120.

The data storage system 1118 can include a machine-readable storage medium 1124 (also known as a computer-readable medium) on which is stored one or more sets of instructions 1128 or software embodying any one or more of the methodologies or functions described herein. The instructions 1128 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1128 include instructions to implement functionality corresponding to the block family manager 113 of FIG. 1. While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of dice; and
a processing device, operatively coupled to the memory device, the processing device to perform operations, comprising:
receiving memory operations to program sets of pages of data across at least a subset of the plurality of dice;
identifying, while programming the sets of pages to the plurality of dice, a plurality of the sets of pages experiencing a variation in a data state metric satisfying a threshold criterion;
partitioning, into a set of partitions, a set of pages of the plurality of the sets of pages;
storing, in a metadata table, at least one bit to indicate that the set of pages is partitioned; and
wherein, for each set of pages of the plurality of the sets of pages:
removing the at least one bit from the metadata table for the set of pages in response to the set of pages reaching a threshold time after program (TAP);
merging the set of partitions into a merged set of pages;
selecting a block family for the merged set of pages; and
consolidating, within the metadata table, a single entry for the merged set of pages, wherein the single entry is associated with the block family.

2. The system of claim 1, wherein the identifying further comprises determining that the plurality of the sets of pages takes more than a threshold time period to completely program, wherein the operations further comprise:
partitioning, into a further set of partitions, each set of pages of the plurality of the sets of pages in addition to the set of pages; and
programming each further set of partitions to the plurality of dice.

3. The system of claim 1, wherein, for each set of pages of the plurality of the sets of pages, each partition of the set of partitions is of a fixed length, and wherein the operations further comprise storing, in the metadata table, a value indicative of the fixed length.

4. The system of claim 3, wherein the operations further comprise:
receiving a read operation directed at a page of the set of pages;
determining, based on a logical block address of the read operation and on the value indicative of the fixed length, a partition of the set of partitions to which the read operation corresponds; and
searching, using a first value associated with the set of pages and a second value associated with the partition, the metadata table to identify a block family to which the partition is assigned.

5. The system of claim 1, wherein each partition is a numbered portion of the set of pages, the set of partitions comprises a maximum number of variable-length partitions, and the operations further comprise storing, in the metadata table in association with the set of pages, an address of a last valid page that was written for each numbered portion of the set of pages.

6. The system of claim 5, wherein the operations further comprise:
receiving a read operation directed at a page of the set of pages;
searching through a plurality of last valid pages of the metadata table to determine a partition of the set of partitions corresponding to a logical block address of the read operation; and searching, using a first value associated with the set of pages and a second value associated with the partition, the metadata table to identify a block family to which the partition is assigned.

7. The system of claim 1, wherein, for each set of pages of the plurality of the sets of pages, the set of partitions comprises a variable number of fixed-length and variable-length partitions, and wherein the operations further comprise storing a value identifying each variable-length partition in an array with a multiple-linked list structure of tracking the variable-length partitions.

8. A method comprising:
receiving, by a memory sub-system of a memory device, memory operations to program sets of pages of data across at least a subset of a plurality of dice;
identifying, by a processing device of the memory sub-system and while programming the sets of pages to the plurality of dice, a plurality of the sets of pages experiencing a variation in temporal voltage shift satisfying a threshold criterion;
partitioning, by the processing device, a set of pages of the plurality of the sets of pages into a set of fixed-length partitions, wherein each fixed-length partition is a numbered sub-group of the set of pages;
storing, by the processing device in a metadata table, a value to indicate a size of each fixed-length partition, and
wherein, for each set of pages of the plurality of the sets of pages:
removing the value from the metadata table for the set of pages in response to the set of fixed-length partitions being assigned to an identical threshold voltage offset bin;
merging the set of fixed-length partitions into a merged set of pages;
selecting a block family for the merged set of pages; and
consolidating, within the metadata table, a single entry for the merged set of pages, wherein the single entry is associated with the block family.

9. The method of claim 8, wherein the identifying further comprises determining that the plurality of the sets of pages takes more than a threshold time period to completely program, the method further comprising:
partitioning, into a further set of partitions, each set of pages of the plurality of the sets of pages in addition to the set of pages; and
programming each further set of partitions to the plurality of dice.

10. The method of claim 8, wherein the method further comprises:
receiving a read operation directed at a page of the set of pages;
determining, based on a logical block address of the read operation and on the value that indicates the size of each fixed-length partition, a partition of the set of fixed-length partitions to which the read operation corresponds; and
searching within the metadata table to determine a block family to which the partition is assigned, wherein the searching is based on a first value associated with the set of pages and a second value associated with the partition.

11. The method of claim 10, further comprising:
searching a block family table, using an identifier for the block family, to identify a threshold voltage offset bin to which the block family is assigned;
searching a threshold voltage offset table using a bin number for the threshold voltage offset bin to determine one or more threshold voltage offsets value for use in performing the read operation; and
reading data from the page via application of the one or more threshold voltage offset value to a base read level.

12. A method comprising:
receiving, by a memory sub-system of a memory device, memory operations to program sets of pages of data across at least a subset of a plurality of dice;
identifying, by a processing device of the memory sub-system and while programming the sets of pages to the plurality of dice, a plurality of the sets of pages experiencing a variation in temporal voltage shift satisfying a threshold criterion;
partitioning, by the processing device, a set of pages of the plurality of the sets of pages into a set of variable-length partitions, wherein each variable-length partition is a numbered sub-group of the set of pages;
storing, by the processing device in a metadata table, an address of a last valid page that was written for each numbered sub-group of the set of pages;
receiving a read operation directed at a page of the set of pages;
searching through a plurality of last valid pages of the metadata table to determine a partition of the set of variable-length partitions corresponding to a logical block address of the read operation; and
searching within the metadata table to determine a block family to which the partition is assigned, wherein the searching is based on a first value associated with the set of pages and a second value associated with the partition.

13. The method of claim 12, wherein the identifying further comprises determining that the plurality of the sets of pages takes more than a threshold time period to completely program, the method further comprising:
partitioning, into a further set of partitions, each set of pages of the plurality of the sets of pages in addition to the set of pages; and
programming each further set of partitions to the plurality of dice.

14. The method of claim 12, wherein, for each set of pages of the plurality of the set of pages, the method further comprises:
removing the address of the last valid page from the metadata table for the set of pages in response to the set of pages reaching a threshold time after program (TAP);
merging the set of variable-length partitions into a merged set of pages;
selecting a block family for the merged set of pages; and
consolidating, within the metadata table, a single entry for the merged set of pages, wherein the single entry is associated with the block family.

15. The method of claim 12, wherein, for each set of pages of the plurality of the sets of pages, the method further comprising:
removing the address of the last valid page from the metadata table for the set of variable-length partitions are assigned to an identical threshold voltage offset bin;
merging the set of variable-length partitions into a merged set of pages;
selecting a block family for the merged set of pages; and consolidating, within the metadata table, a single entry for the merged set of pages, wherein the single entry is associated with the block family.

\* \* \* \* \*